United States Patent
Bracha et al.

(10) Patent No.: US 6,505,331 B1
(45) Date of Patent: *Jan. 7, 2003

(54) METHOD FOR ROUTING OF NETS IN AN ELECTRONIC DEVICE

(75) Inventors: Gabriel Bracha, Tel Aviv (IL); Eytan Weisberger, Ramat Hasharon (IL); Ilan Algor, Ganei-Tikva (IL)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/730,046

(22) Filed: Oct. 15, 1996

(51) Int. Cl.$^7$ .............................................. G06F 17/50
(52) U.S. Cl. ............................. 716/12; 716/2; 716/11; 716/13; 716/14; 716/16
(58) Field of Search ................................ 364/488, 489, 364/490, 491; 370/254; 716/2, 11, 12, 13, 14

(56) References Cited

U.S. PATENT DOCUMENTS

| | | | |
|---|---|---|---|
| 4,577,276 A | * 3/1986 | Dunlop et al. | 364/491 |
| 4,811,237 A | * 3/1989 | Putatunda | 364/491 |
| 4,908,772 A | * 3/1990 | Chi | 364/491 |
| 5,491,641 A | 2/1996 | Scepanovic et al. | 364/491 |
| 5,923,646 A | * 7/1999 | Mandhyan | 370/254 |
| 6,014,507 A | * 1/2000 | Fujii | 716/12 |

FOREIGN PATENT DOCUMENTS

WO     WO91/06061     5/1991     ........... G06F/15/60

OTHER PUBLICATIONS

"A weighted Steiner Tree–Based Global Router with Simultaneous Length and Density Minimization", by C Chiang, C.K. Wong, M. Sarratzadeh, 8200 IEEE Transactions on Computer–Aided Design of Integrated Circuits and Systems, vol. 13 No. 12 Dec. 1994, pp. 1461–1469.

\* cited by examiner

Primary Examiner—Matthew Smith
Assistant Examiner—Thuan Do

(57) ABSTRACT

In laying out electonic devices on a substrate the routing of nets is important in minimizing conductor area and improving performance. A method for routing of nets in an electonic device which has a plurality of clusters is disclosed which separates the intra cluster routing and the channel routing between the clusters. For the intra cluster routing a topological graph is proposed to be used for mapping a subgraph which is representative of the nodes in a net belonging to a cluster to be routed.

13 Claims, 10 Drawing Sheets

☒ = NODE
☐ = VIA

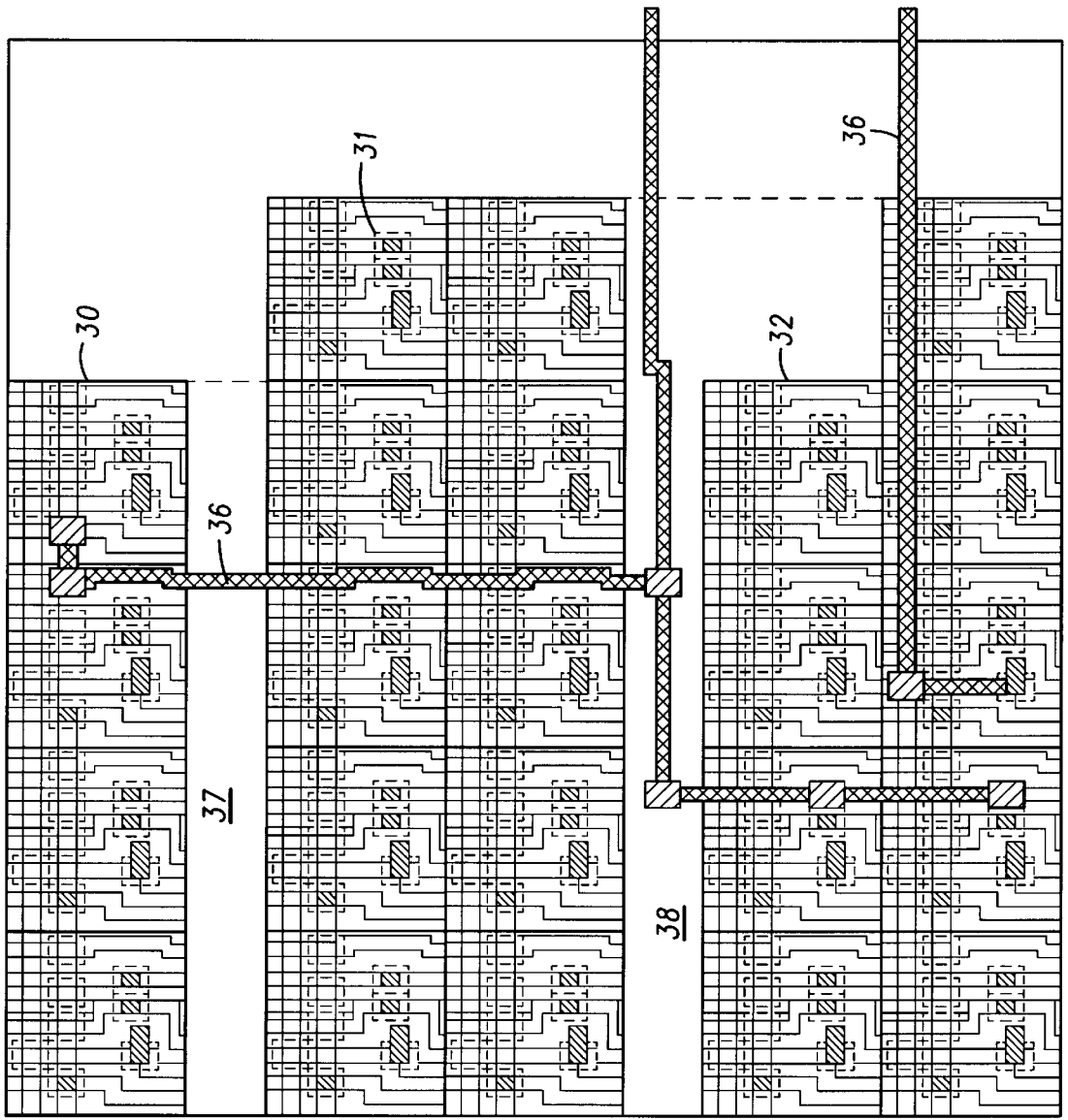

METHOD FOR ROUTING OF NETS IN AN ELECTRONIC DEVICE

TECHNICAL FIELD

This invention relates to the design of electronic devices, such as integrated circuit chips and, more particularly, to the routing of nets in such chips to minimize the interconnection cost and to maximize the speed of operation.

BACKGROUND OF THE INVENTION

From the prior art a number of approaches for designing very large scale integrated (VLSI) circuit chips is known especially as far as the routing of nets between the internal components of a chip are concerned. Channel routing is used extensively in the layout of integrated circuits and printed circuit boards. It is flexible enough to allow its use in various design styles such as gate-arrays, standard cells, and macro cells.

A channel router is designed to route nets that interconnect nodes on two opposite sides of a region called the channel. Criteria for a good channel router are that it routes the interconnections in a minimum area, the added length of the net wiring being also at a minimum. Examples for prior art channel routers are described for example in IEEE TRANSACTIONS ON COMPUTER-AIDED DESIGN, VOL. CAD-4, NO. 3, JULY 1985, pages 208–219, by James Reed et al and in "CHAMELEON: A NEW MULTI-LAYER CHANNEL ROUTER", Douglas Braunt et al. IEEE, 1986, conference proceedings of the 23rd design automation conference.

In order to increase the overall quality of the routing attempts have been made to include information about the so called "feed-throughs" in the process of channel routing. Such approaches are known from "FEED THROUGH RIVER ROUTING", A. Joseph et al, INTEGRATION, the VLSI Journal 8, pages 41–50, El Revier Science Publishers B.V., 1989 and "MULTI CHANNEL OPTIMIZATION IN GATE-ARRAY LSI LAYOUT", K. Aoshima and E. S. Kuh, IEEE, 1983.

Since there is a constant need to further increase the wiring density in VLSI technology it is an underlying problem of the invention to devise an improved method for routing of nets for the design of electronic devices.

SUMMARY OF THE INVENTION

The underlying problem of the invention is solved basically by applying the features laid down in the independent claims. Preferred embodiments of the invention are given in the dependent claims.

The invention is advantageous in that it allows to design a VLSI layout requiring a minimum of silicon floor space which has a positive effect on chip yield and price. These extreme layout densities can be obtained by a fully automated solution which only requires moderate computing resources in terms of computer memory and run time.

The invention allows to generate separate sub graphs which contain the nodes to be connected both for the so called "cluster areas" and the "channel areas". These sub graphs are derived from input data which comprise the nodes of each net to be routed as well as the assignment of the nodes to clusters. Additional logical nodes which are defined by means of a minimal Steiner tree are inserted into the input data whereby the subgraphs are found. When the clusters are aligned horizontally it is advantageous to use rectilinear Steiner trees for defining such additional logical nodes.

Each cluster has one subgraph for each net to be wired. Analogously each channel has a dedicated subgraph for each net. As the subgraphs are descriptive of the interconnections to be established any method, including hand crafted design, can be used to actually route the subgraphs—or with other words—to map the subgrahs onto the physical design of the integrated circuit chip.

For routing the channel area a lot of automated prior art methods are known. If such a method is to be employed the subgraphs of the channel areas can be used as input data for such prior art methods.

For routing of the clusters it is advantageous to employ the automated routing method which is described in the dependent method claims. For this method first the actual electrical connectivities which can be established between the nodes in each of the clusters have to be described. This is done by a graph representation which forms the basis of the intra cluster routing method.

According to this method subgraphs which represent the desired electrical interconnections to be established between the nodes in a given cluster are mapped on a graph which represents the potential electrical connectivities within the given cluster. To carry out this procedure no human interaction is required. The steps of the method of the invention can be realized by programming a general purpose digital computer, which is fed with the required design data, i.e. the placement of the clusters, the nets to be wired and the assignment of the nodes of the nets to the clusters.

BRIEF DESCRIPTION OF THE DRAWING

FIG. 3 is a portion of a circuit diagram which illustrates the formation of clusters and channels between the clusters;

In FIG. 1 there is shown a schematic view of the circuit layout of bit cell 19. A bit cell which sometimes is also called a leave cell is the basic building block of a functional block in an integrated circuit, such as a data-path block. In general terms, a bit cell is planned to perform a given functionality, to provide a certain interface for connections, and to support traversing routing through and/or over itself.

The cell functionality of a bit cell is established by transistors and predefined via geometries. Certain points within a bit cell are designated as internal pins or potential connection points. Such points will be referred to as "nodes" in the following. The nodes are typically implemented in the top most metal layer of the circuit structure but can also be implemented in any other layer.

The typical way of establishing a connection to a pin is by vias. Vias are layout structures that allow traversing from one layer of the circuit topology to another. In order to optimize the layout process optional or potential vias are available in the underlying structure of the electronic device to be designed. When the potential vias are not required for the circuit layout they do not obstruct and allow other routing to traverse.

In addition one can designate special paths that are potential connections of the node of a bit cell to the boundary of the bit cell, or that traverse the bit cell from one side to another. Such structures are termed feed-throughs. These are also potential geometries of connectivities that are only implemented if they are actually required to establish the routing between the nodes of bit cells or to traverse over a bit cell.

By way of example the bit cell 19 has a number of vertical feed-throughs 10 and horizontal feed-throughs 12. The feed throughs 10 and 12 define potential wiring geometries which can be used for routing the integrated circuit. Vias 14 which are symbolized by the filled dashed boxes in FIG. 1 serve to interconnect nodes 18 to the feed throughs.

Figure 1:
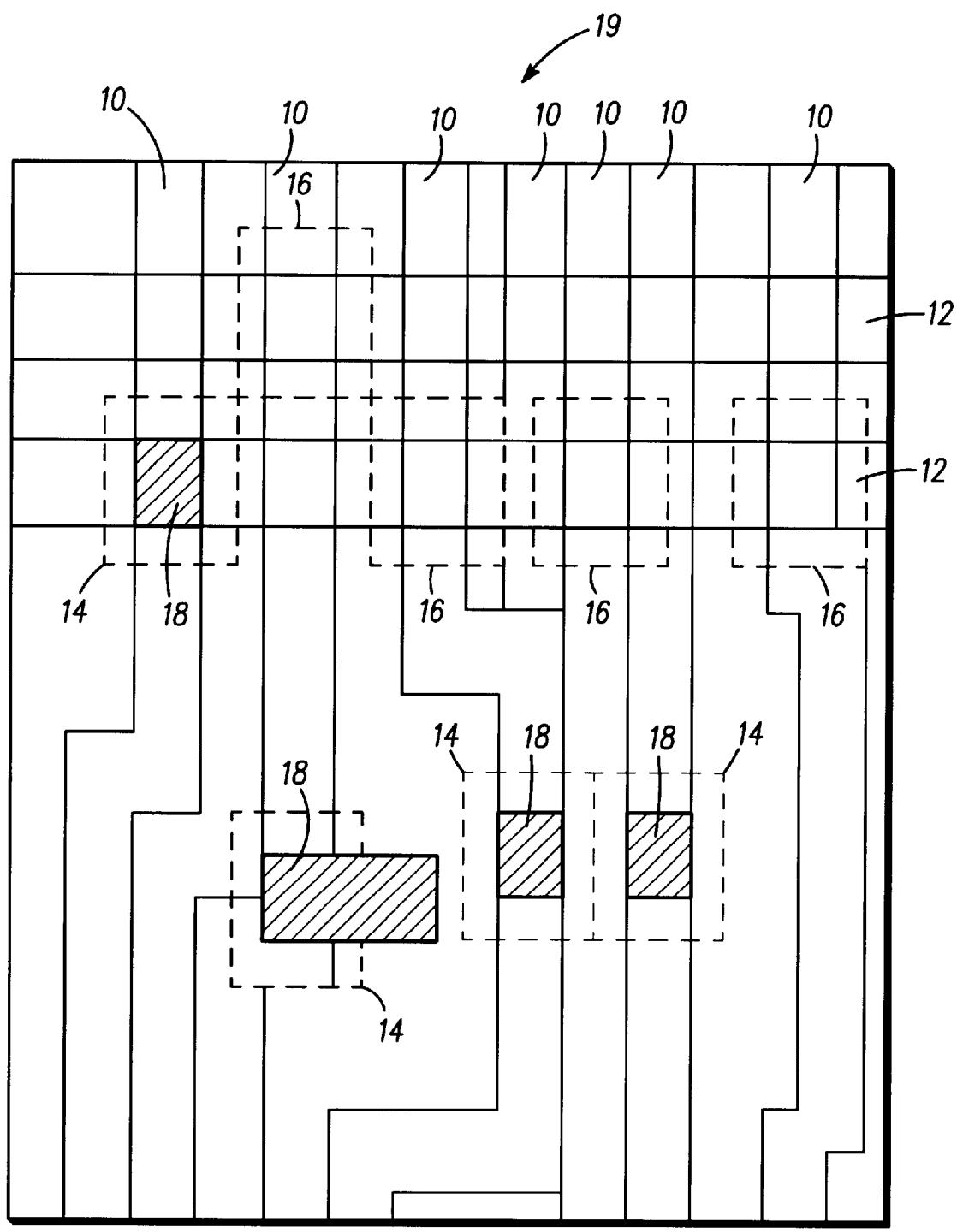
FIG. 1 is a schematic circuit diagram illustrating the structure of a bit cell.

Vias 16 which are symbolized by the empty dashed boxes in FIG. 1 define potential vias which are not directly assigned to one of the nodes 18. Hence the feed throughs 10, 12 and the vias 14, 16 define allowed electrical connectivities for interconnecting the nodes 18 within the bit cell 19 to nodes within the same bit cell 19 or to other bit cells or external pins of the integrated circuit chip not shown in FIG. 1.

Figure 2A:
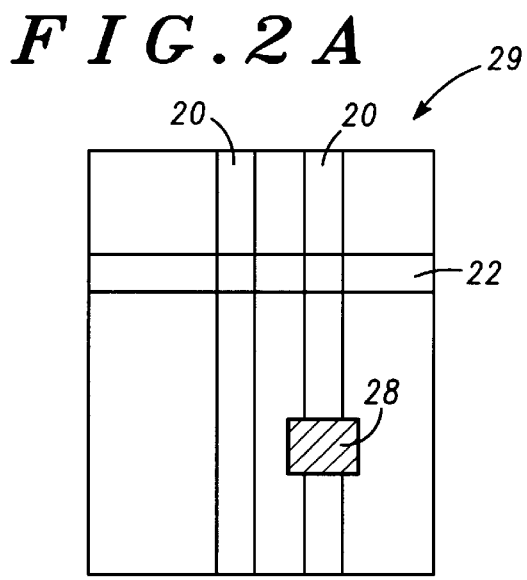
FIG. 2 is a simiplified diagram to illustrate the process of concatenating individual bit cells and cluster routing.
Figure 2B:
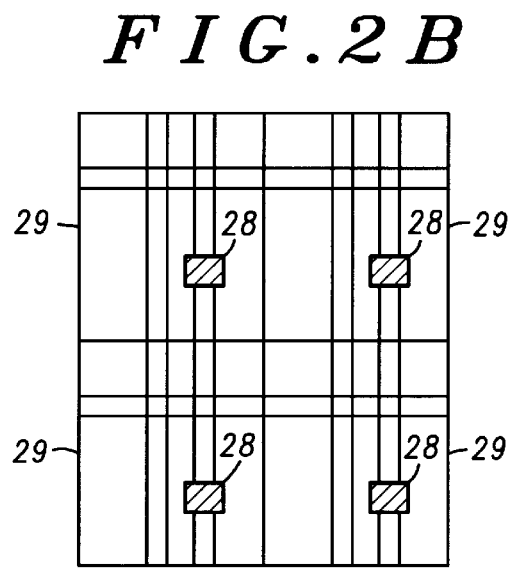
Figure 2C:
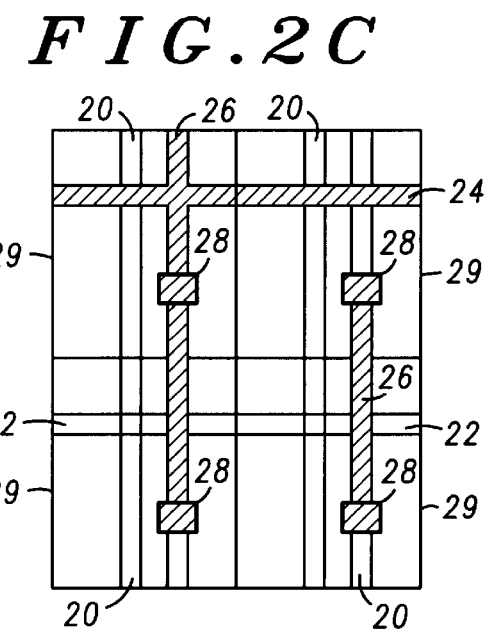

FIG. 2 includes a sequence of three figures, i.e. FIGS. 2A, 2B and 2C to illustrate the process of concatenation and routing. FIG. 2A shows a bit cell 29 which is similar to bit cell 19 of FIG. 1. For clarity the layout of the bit cell 29 is simplified: the bit cell 29 has only feed throughs 20 and 22 as well as a node 28 even though in practice a much larger number of components and wiring geometries typically is present.

FIG. 2B illustrates how a plurality of bit cells 29 are concatenated. The feed throughs 20, 22 are designed so that when cells are concatenated or abutted, their feed throughs also abbut to create longer and more complex potential paths for connectivities to form a lattice or grid that spans a plurality of concatenated bit cells. Such a grid simplifies the task for the router software.

FIG. 2C shows by way of example how the concatenated bit cells 29 of FIG. 2B are routed. The hatched or "painted" feed throughs 24 and 26 are actually used for the physical implementation of the integrated circuit whereas the other potential electrical connectivities as defined by the remaining feed throughs 20, 22 are not used to establish electrical interconnections between nodes 28.

FIG. 3 shows a portion of integrated circuit chip 39. The integrated circuit chip 39 comprises a large number of clusters. For simplicity only clusters 30, 31 and 32 are shown in FIG. 3. Each of the clusters 30, 31 and 32 comprises a plurality of bit cells which are concatenated like shown in FIG. 2. The gaps between the clusters 30, 31 and 32 are referred to as channels. Channel 37 is situated between the clusters 30 and 31; channel 38 is situated between the clusters 31 and 32. The clusters 30, 31 and 32 are interconnected by the wiring 36. The wiring 36 is composed of horizontal and vertical routes as well as vias.

One portion of the wiring 36 is implemented inside the clusters 30, 31 and 32 which is called intra cluster routing. Another portion of the wiring 36 is implemented in the channel areas 37, 38; this portion of the wiring 36 is referred to as channel routing. For simplicity only a small number of routes are shown in FIG. 3.

Figure 4:
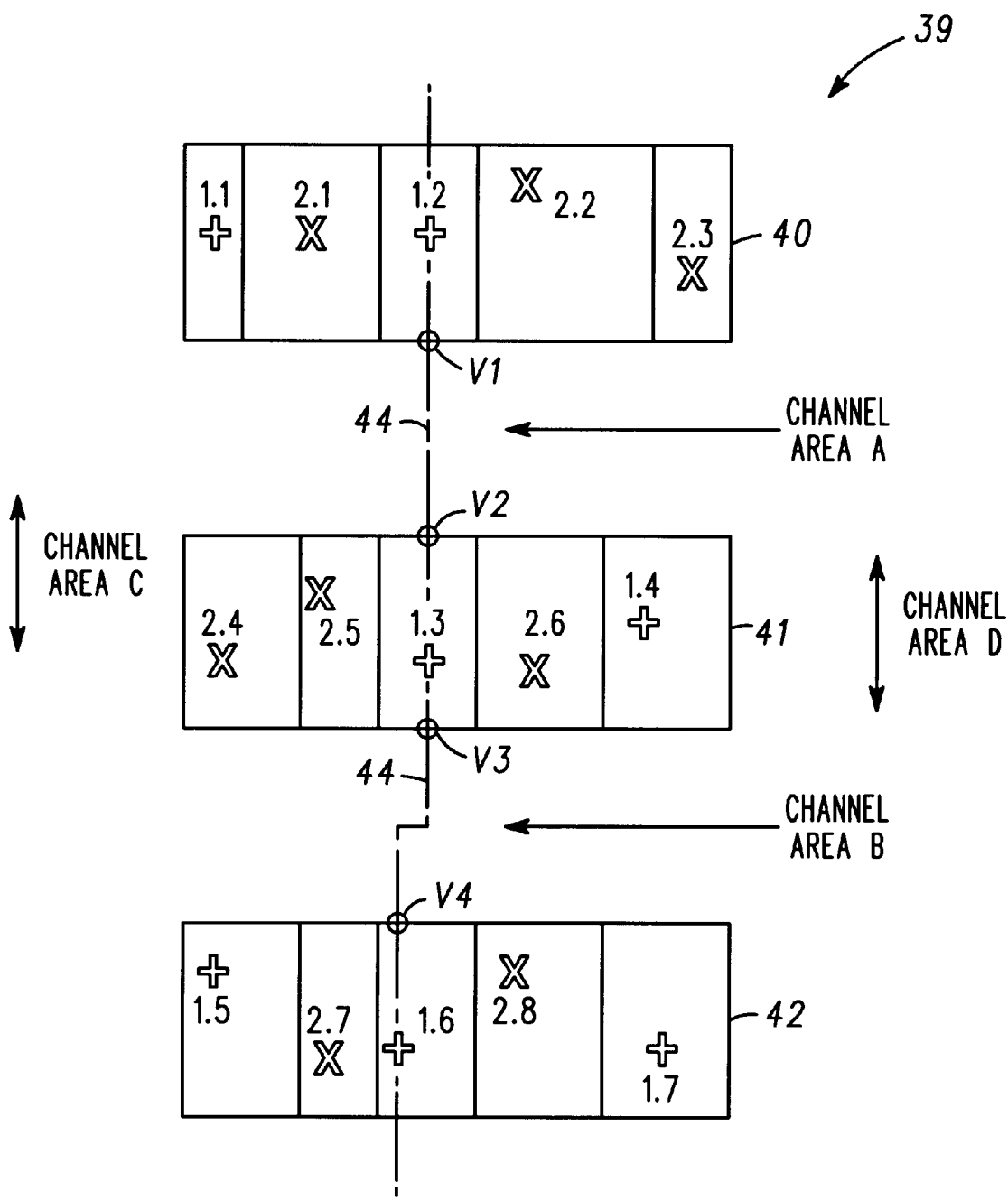
FIG. 4 is a simplified circuit diagram which illustrates the definition of logical nodes.

FIG. 4 comprises a schematic representation of clusters 40, 41 and 42 of the integrated circuit chip 39. Each of the clusters 40, 41 and 42 comprises a number of concatenated bit cells. The bit cells of the cluster 40 have nodes 1.1, 2.1, 1.2, 2.2 and 2.3; the bit cells of cluster 41 have nodes 2.4, 2.5, 1.3, 2.6 and 1.4; the bit cells of cluster 42 have nodes 1.5, 2.7, 1.6, 2.8 and 1.7. These nodes belong to different nets: a set of nodes which are to be interconnected to the same signal will be referred to as a net in the following.

All nodes 1.x belong to net 1 whereas all nodes 2.x belong to net 2. For proper operation of the integrated circuitry to be implemented it is essential that the routes of different nets which interconnect the required nodes do not contact. On the other hand for good utilization of the available silicon floor space and for short signal propagation delays a minimum over all length of the circuit wiring is highly desirable. This applies both to the intra cluster routing of the clusters 40, 41 and 42 as well as to the channel routing.

In the example considered here there is a channel area A in the horizontal direction between clusters 40 and 41 and a channel area B between the clusters 41 and 42 as well as channel areas C and D in the vertical direction.

For routing the nets in a first step a minimal Steiner tree 44 which interconnects the nodes belonging to net 1 of all of the clusters of the integrated circuit including clusters 30, 31, 32, 40, 41 and 42 is established. The condition for the minimal Steiner tree 44 is that a) it interconnects at least one node of net 1 of each of the clusters, provided that there is at least one node belonging to net 1 in a given cluster; and that b) its overall length is minimal.

This applies analogously for minimal Steiner trees for other nets, e.g. net 2. Since only rectilinear routes are allowed in the technical environment considered here also the Steiner tree 44 has to be rectilinear. The theory of Steiner trees as such is known from the art, e.g. from M. Hanan, "ON STEINER MINIMUM TREES WITH RECTILINEAR DISTANCES", SIAM, J. Appl. Math. Vol 16, no. 1, pages 255–265, 1966. The usage of rectilinear Steiner trees is also devised in U.S. Pat. No. 4,577,276 to Dunlop et al. for laying out integrated circuits on a substrate.

The Steiner tree 44 for the net 1 interconnects one node belonging to net 1 in each of the clusters. As shown in FIG. 4 the Steiner tree 44 logically interconnects the node 1.2 in cluster 40, node 1.3 in cluster 41 and node 1.6 in cluster 42. Other clusters which contain at least one node which belongs to net 1 which are not shown in FIG. 4 are also spanned by the Steiner tree 44 in the same way.

Analogously a minimum Steiner tree is also established for the net 2. For simplicity the Steiner tree of net 2 is not shown in FIG. 4. In a practical design much more than 2 nets are present so that a large number of Steiner trees is established in a practical design.

Not all clusters necessarily comprise a node of each net in a practical design. Hence for each net a subset of clusters exists. Each cluster belonging to such a subset comprises at least one node belonging to the net to which the subset of that cluster is assigned. In the more general case considered here a minimal Steiner tree of one of the nets to be routed has to span all clusters of this net. Thereby at least one node of each cluster having a node belonging to the net to be routed is logically interconnected to at least another node of the same net in the other clusters of the same subset of clusters.

It is to be noted that the minimal Steiner trees, especially steiner tree 44 shown in FIG. 4, do not directly define the placement of the circuit wiring. Once the Steiner trees are found, i.e. one minimal Steiner tree for each net, additional logical nodes are defined for generating an enhanced graph representation of each of the nets to be routed.

These logical nodes are determined by the intersections of the Steiner trees with the boundaries of the channel area. In the example considered in FIG. 4 these are the logical nodes V1, V2, V3 and V4. The logical node V1 is situated at the intersection of the Steiner tree 44 and the lower boundary of cluster 40 to the channel area A. Likewise the logical node V2 is situated at the upper boundary of cluster 41 to the channel area A; logical node V3 is situated at the lower boundary of cluster 41 to the channel area B and logical node V4 is situated at the upper boundary of cluster 42 to the channel area B. The minimal Steiner tree of each of the nets to be routed yields such logical nodes.

Figure 5:
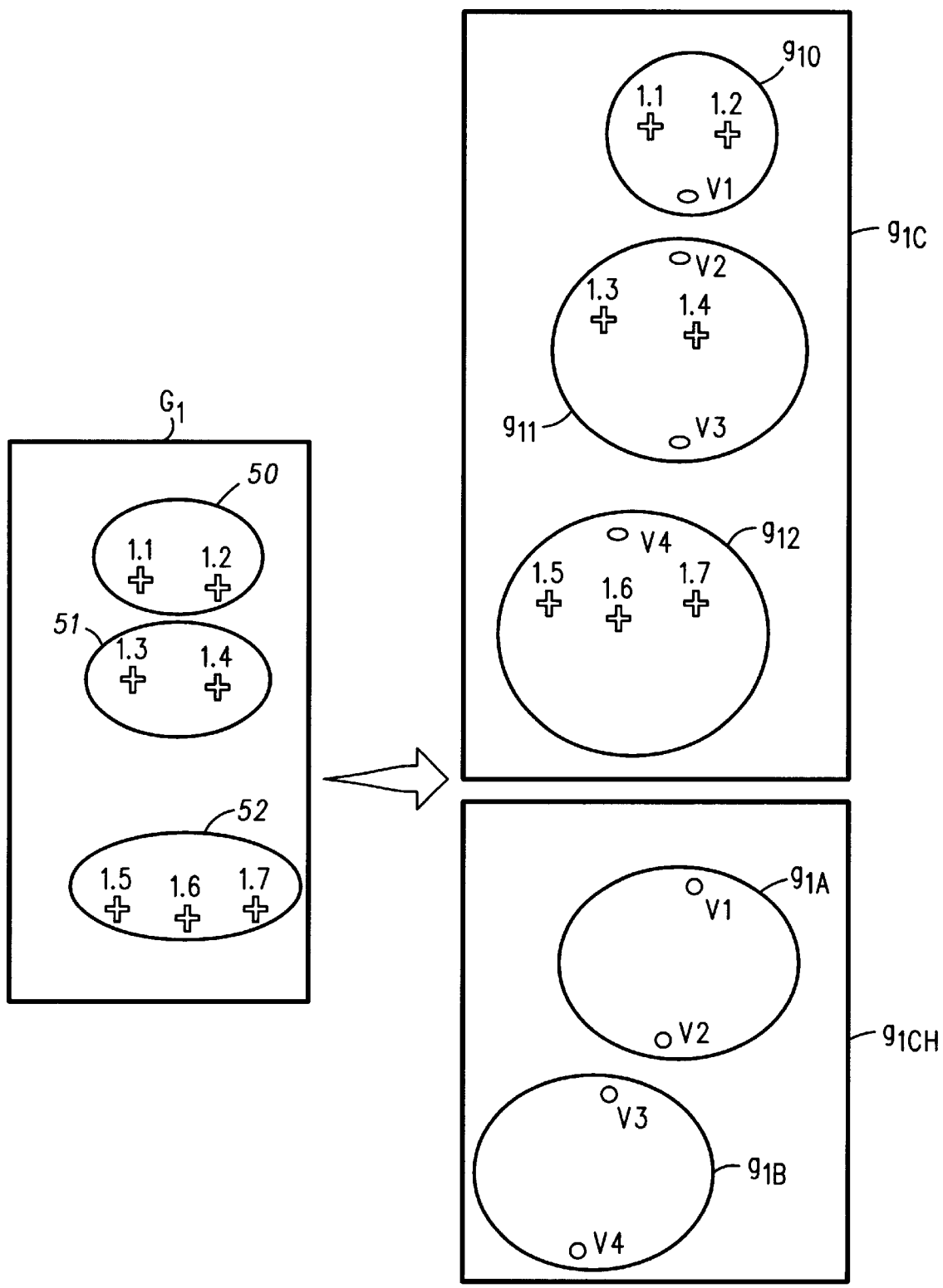
FIG. 5 is a diagram which shows the transformation of the input data into two separate subgraphs.

FIG. 5 shows a graph representation $G_1$ of the portion of net 1 shown in FIG. 4. The graph representation $G_1$ comprises a list of the nodes 1.x which are assigned to the net 1. Further, the graph representation comprises topological information as regards the placement of the nodes 1.x in the clusters. This information is symbolized by the sets 50, 51 and 52 corresponding to clusters 40, 41 and 42 of FIG. 4, respectively. The information contained in the graph representation $G_1$ is required as input data.

The additional logical nodes V1, V2, V3 and V4 which are found by means of the minimal Steiner tree 44 are included into the graph representation of the net 1 so that the graph representation $G_1$ is transformed to the graph representations $g_{1C}$ and $g_{1CH}$. This transformation is performed by including the additional logical nodes V1, V2, V3 and V4 into the list of nodes contained in the graph representation G1.

The additional logical nodes are inserted into the subset of nodes 50, 51 and 52 so that the subgraphs $g_{10}$, $g_{11}$ and $g_{12}$ result. The portions of the Steiner tree 44 which are in the channel areas are reflected in the graph representation $g_{1CH}$ which comprises the subgraphs $g_{1A}$ and $g_{1B}$. The subgraph $g_{1A}$ is representative of the interconnections to be established for the net 1 over the channel area A, whereas the subgraph $g_{1B}$ is representative of the interconnections to be established for the net 1 over the channel area B—the so called channel routing.

Hence, the subgraph $g_{1A}$ includes the logical nodes V1 and V2 which are situated at the boundary of channel A and which are interconnected by the Steiner tree 44, whereas the subgraph $g_{1B}$ includes the interconnected logical nodes V3 and V4 which are situated at the boundary of the channel area B.

Thus two different sets of subgraphs result for the net 1: the first set of subgraphs comprises subgraphs $g_{10}$, $g_{11}$, $g_{12}$. Each of these subgraphs covers one of the clusters as far as the nodes and the logical nodes for net 1 inside that cluster are concerned.

The second set of subgraphs comprises the subgraphs $g_{1A}$ and $g_{1B}$. This set of subgraphs covers the channel areas A and B.

For simplicity and clarity the corresponding graphs for net 2 are not shown in the FIG. 5.

Figure 6:
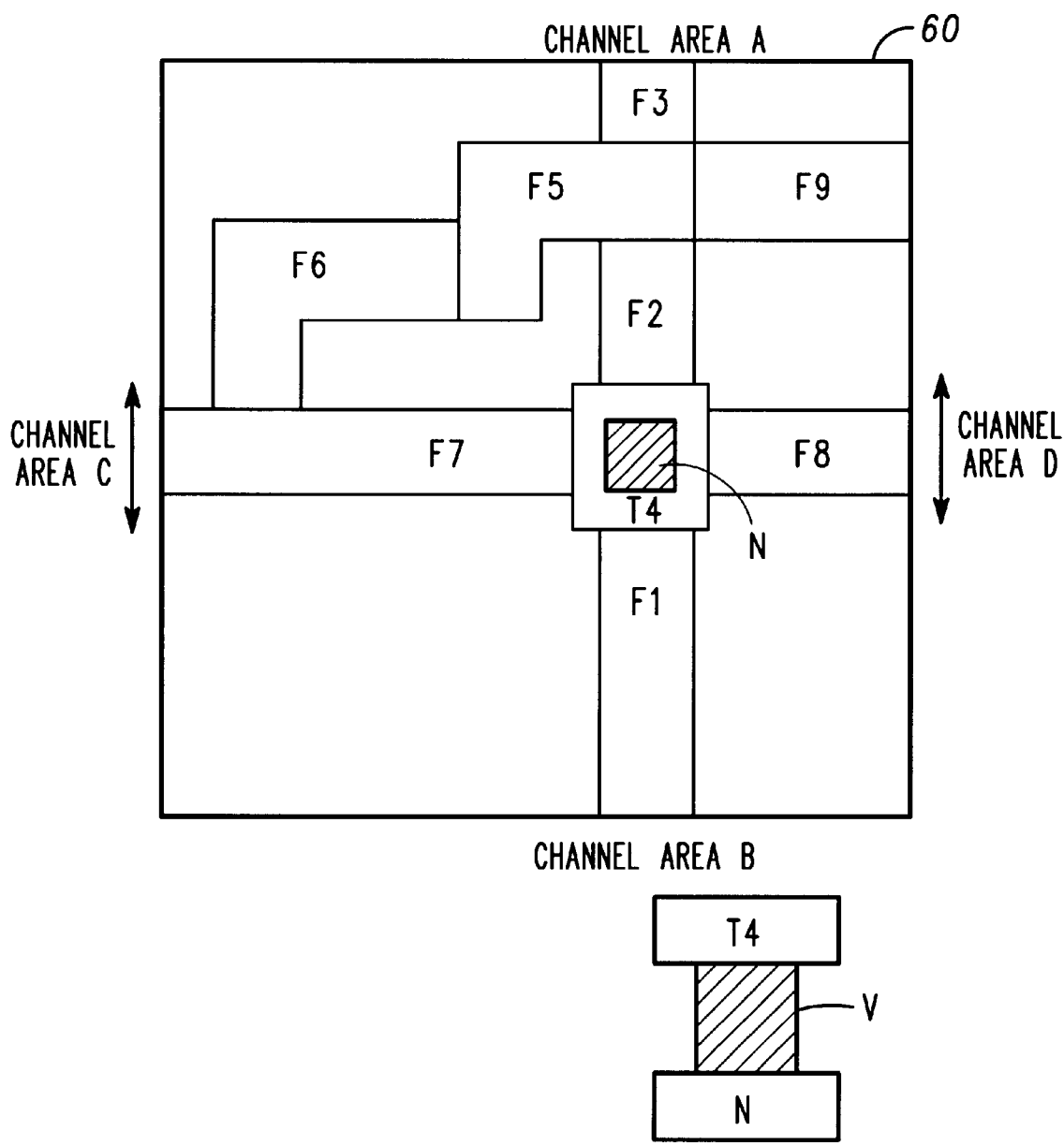
FIGS. 6 and 7 show the modeling of the feed throughs according to the invention.
Figure 7:
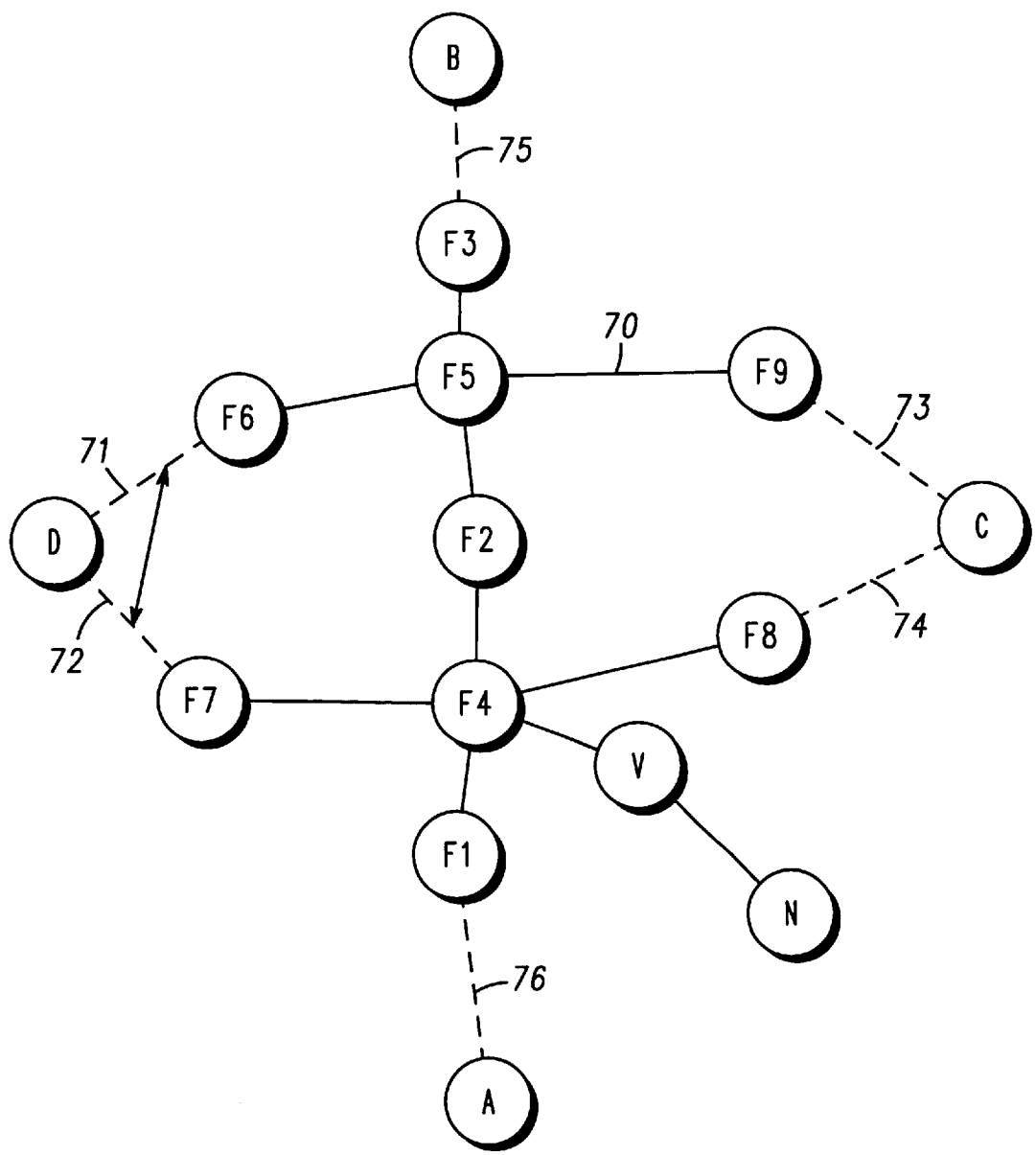

FIG. 6 shows a simplified example of potential connectivities which can be physically implemented within a cluster area 60. Within the cluster area 60 there is a node N which can be interconnected by a via V to a top plate T4 of the via V. The top plate T4 can be contacted by one of the feed throughs F1, F2, F7 and F8. By way of the feed throughs F2 and F7 other feed throughs F3, F5, F6 or F9 can be accessed. The feed throughs as well as the top plate T4 and the via V define allowed electrical connectivities which can be used by the router to wire the nets. The information contained in FIG. 6 is modelled by graph representation shown in FIG. 7:

There are three different types of edges in the graph of FIG. 7: The first type of edge establishes geometrical adjacency between its vertices. Geometrical adjacency means that there is an potential electrical connectivity between the vertices of that edge. For example, the edge 70 which links the vertices F5 and F9 represents the geometry of the cluster area 60 of FIG. 6 in which the feed throughs F5 and F9 abut so that an electrical connectivity making usage of the concatenated feets F5 and F9 can be established. This type of geometrical adjacency is symbolized by a normal straight line between vertices in FIG. 7.

The second type of edges establishes a mutual exclusion relation between its vertices with respect to different nets. This is the case for the edges 71 and 72 which link the vertices D, F6 and D, F7, respectively. The mutual exclusion relation between the edges 71 and 72 is symbolized by the double headed arrow between these edges. The mutual exclusion relation is representative of the fact that the feets F6 and F7 can not be used for wiring different nets. This is due to the fact that in the topology of allowed electrical connectivities shown in FIG. 6 the feed throughs F7 and F6 contact so that both feed throughs F6 and F7 can not be used for wiring different nets having different signals. Otherwise a shortcircuit between the nets carrying different signals would result. Such a relationship of mutual exclusion does not exist between the feed through F8 and F9 since these feed throughs do not contact in the circuit topology shown in FIG. 6.

The third type of edge establishes a channel border relation for representation of the additional logical nodes. The vertices A, B, C and D are representations of such logical nodes analogous to the logical nodes V1, V2, V3 and V4 of FIG. 4. This third type of edge symbolizes an allowed electrical connectivity by way of a feed through, via or node to an additional logical node of one of the channel areas. In the example considered here these are the vertices 74 to 76 which are represented by dashed lines.

For example the feed through F3 directly interconnects the cluster area 60 to the channel area A and thus can serve to establish an interconnection to the logical point V1 which has been found by means of the minimal Steiner tree 44 (cf. FIG. 4).

Relationships of mutual exclusion can only exist between edges of the third type.

The graph shown in FIG. 7 is used for mapping the subgraphs which are representative of the interconnections of nodes belonging to the same net within one cluster, for example $g_{10}$, $g_{11}$, $g_{12}$ of FIG. 5, onto the actual allowed electrical connections of the given circuit topology, including potential connectivieties.

Figure 8:
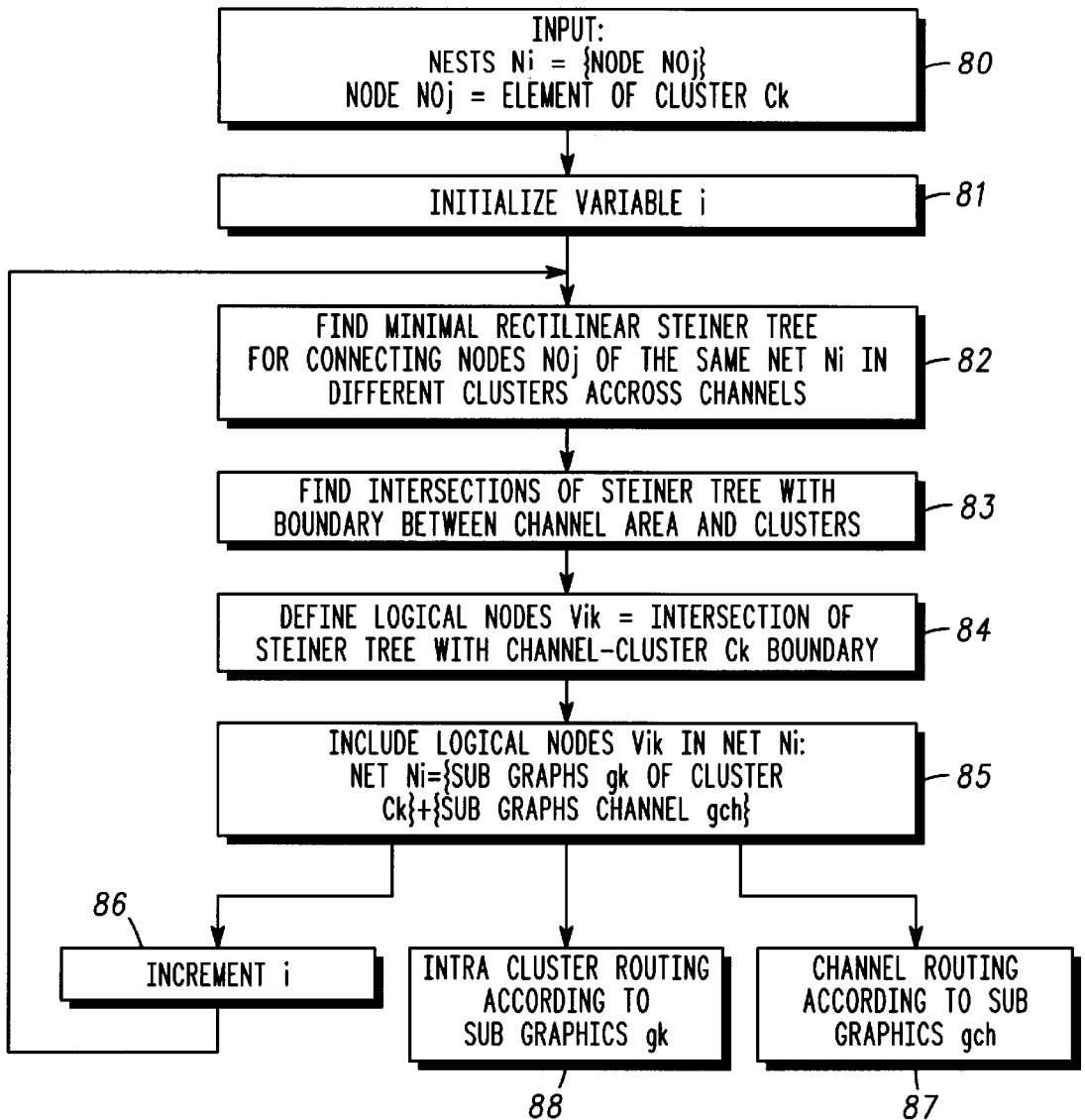
FIG. 8 is a flow chart illustrating the generation of subgraphs for cluster and channel routing.

FIG. 8 is a flow chart illustrating one embodiment of the method of the invention. According to this embodiment the method is carried out by a computer program without human interaction.

In step 80 the input data are provided to the computer program. The input data are sets of nodes $NO_j$. Each set of nodes $NO_j$ defines one net $N_i$ to be routed. All nodes within the same net eventually have to be interconnected. Further information is provided for each of the nodes $NO_j$ to which one of the clusters $C_k$ it belongs. This information is equivalent to the graph representation $G_1$ of FIG. 5.

In step 81 the variable i is initialized to select one of the nets $N_i$ for routing. In step 82 a minimal rectilinear steiner tree is generated for the selected net $N_i$. Like in the example described in FIG. 4 the minimal rectilinear Steiner tree connects nodes $NO_j$ of the same net $N_i$ in different clusters across the channels. In step 83 the intersections of the Steiner tree found in step 82 with the boundary between the channel areas and the clusters are determined.

In step 84 the logical nodes $V_{ik}$ are defined as the intersections of the Steiner tree with the channel cluster boundary as determined in step 82. This is analogous to the definition of the logical nodes V1, V2, V3 and V4 of FIG. 4.

In step 85 the logical nodes $V_{ik}$ found in step 84 are included in the net $N_i$. Thereby subgraphs $g_k$ for the clusters and subgraphs $g_{CH}$ for the channels are generated in the same way as shown in the example of FIG. 5 where the subgraphs $g_{10}$, $g_{11}$, $g_{12}$ for the clusters and $g_{1A}$, $g_{1B}$ for the channels result. After step 85 is carried out the variable i is incremented to select another net $N_i$. This incremention is performed in step 86. The above described loop of steps 82 to 85 is carried out for all nets $N_i$ until i reaches its maximum value as defined by the number of nets which are inputted.

If i reaches its maximum value all required subgraphs are generated and the control goes to steps 87 and 88. In step 87 the routing of the interconnections of nodes belonging to the same net is carried out for the internal area of each cluster— so called intra cluster routing—whereas in step 88 each of the subgraphs $g_{CH}$ belonging to different ones of the nets $N_i$ are channel routed.

This task of routing the subgraphs $g_k$ and $g_{CH}$ can be described as mapping the subgraphs onto the actual circuit topology which has a certain number of allowed electrical connectivities. The task of routing—or with other words mapping—the subgraphs $g_k$ and $g_{CH}$ can be carried out by any appropriate method, including hand crafted mapping. However, in order to optimize this process, it is advantageous to employ a prefered embodiment of a method according to the invention which allows to carry out the routing automatically. Therefore the generation of a model which represents potential electrical connectivities of the physical circuit topology is required.

Figure 9:
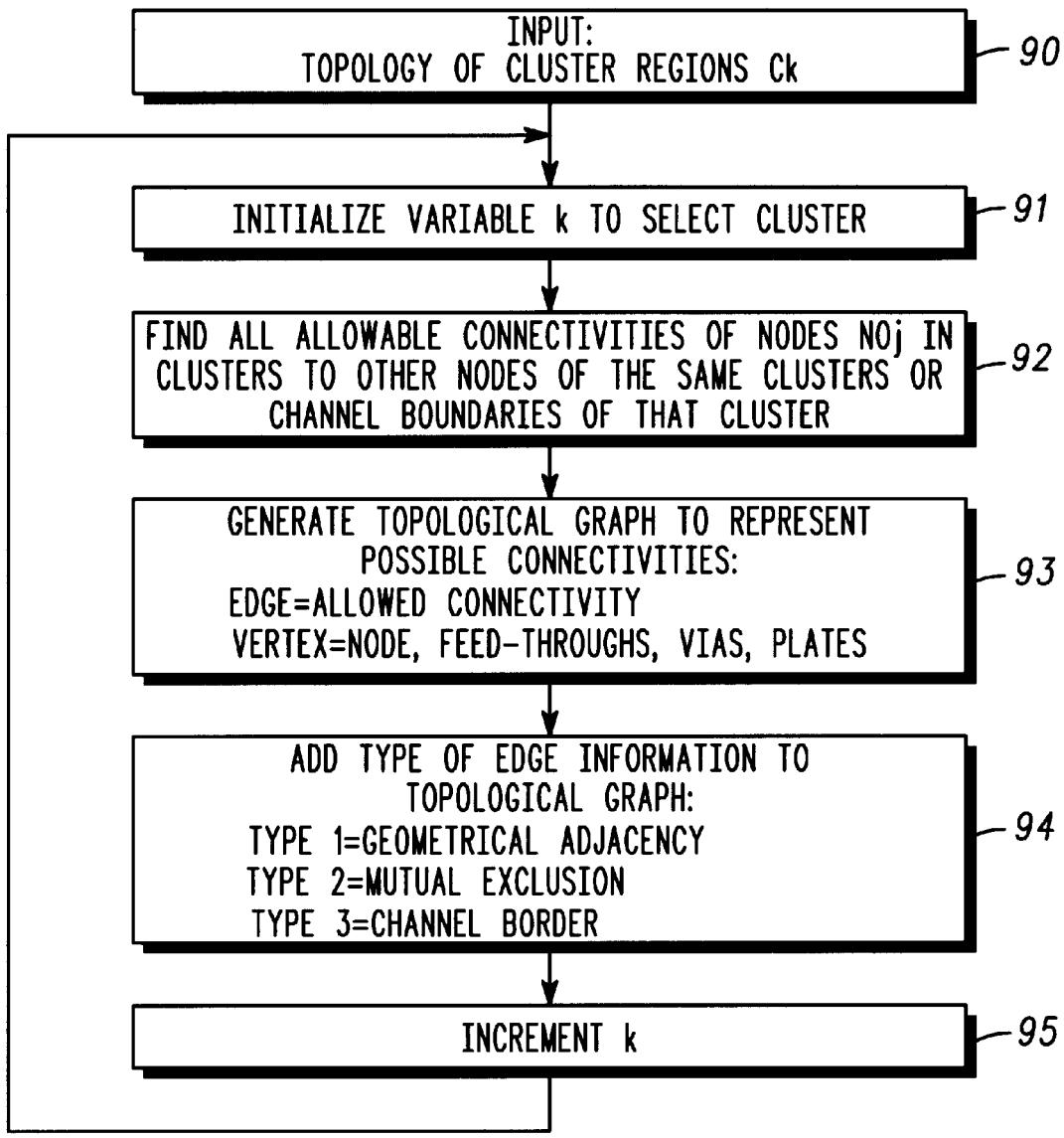
FIG. 9 is a flow chart illustrating the generation of a graph which represents potential connectivities in a cluster.

FIG. 9 is a flow chart which illustrates the generation of such a model. In step 90 topology data of one of the cluster regions $C_k$ are inputted. These topology data are representative of the placement of feed throughs, vias, top and bottom plates and the like as shown in the example of FIG. 6. The representation of the topology data of potential connectivities of the clusters can be in any form.

In step 91 the variable k is initialized to select one of the clusters $C_k$. In step 92 the input data of step 90 is analyzed to find all potential connectivities of nodes NOj in the selected cluster to other nodes in the same cluster or to channel boundaries of the same cluster irrespective of any assignment of the nodes to specific nets. After the analyzation of the input data in step 92 a graph is generated in step 93 which represents the allowed connectivities. Each vertice in the graph is representative of an element of the circuitry like nodes, feed throughs, vias and top or ground plates whereas the edges between these vertices are representative of allowed connectivities between these potential circuit elements.

In step 94 the information about the type of each edge is added to the graph generated in step 93. A type 1 edge defines geometrical adjacency between its vertex elements, an edge of type 2 defines mutual exclusion of the electrical connectivities as indicated for example by the double headed arrow in FIG. 7. An edge of type 3 defines a channel border relation.

Subsequently in step 95 the variable k is incremented so that another cluster $C_k$ is selected. Hence the steps 91 to 94 are repeated for all clusters $C_k$ which are inputted in step 90.

Figure 10:
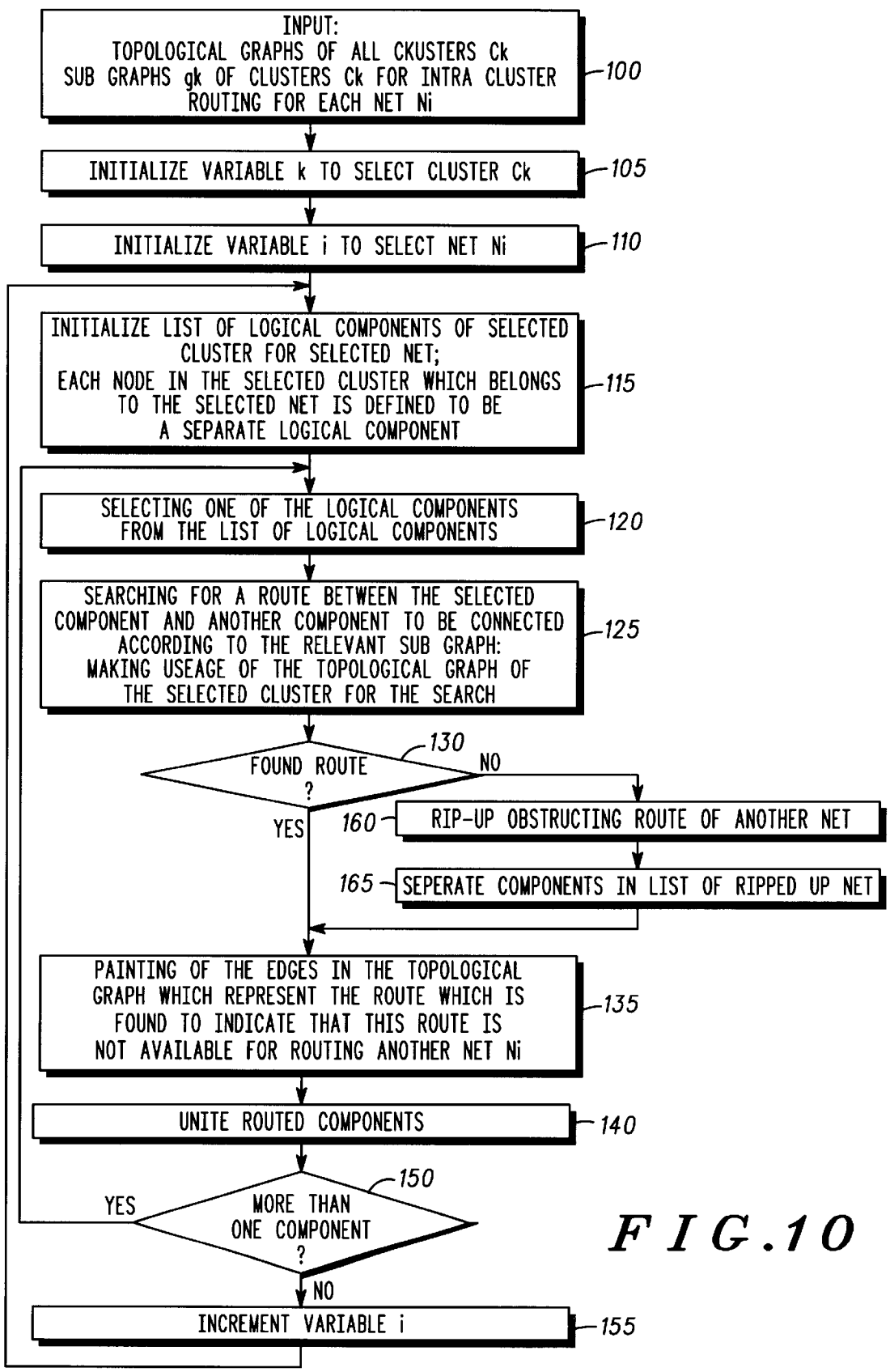
FIG. 10 is a flow chart which illustrates the intra cluster routing according to the invention.

FIG. 10 illustrates one embodiment of the method of the invention for performing the intra cluster routing of nets by mapping the cluster subgraphs generated by means of the Steiner trees on to the model of allowed electrical connectivities established in accordance with the method of FIG. 9.

In step 100 the input data are provided. The required input data are the topological graphs of all the clusters $C_k$ which have been found as a result of the method of FIG. 9. Further all the subgraphs $g_k$ of the clusters $C_k$ for each net $N_i$ are also inputted. The subgraphs gbare generated according to the method as described above with reference to FIG. 8. The method described here with reference to FIG. 10 is one way of implementing step 88 of FIG. 8.

In step 105 the variable k is initialized to select one of the clusters $C_k$. In step 110 the variable i is initialized to select one of the nets $N_i$ to be routed.

In step 115 a list of logical components for the selected cluster is initialized for purposes of routing the selected net. Initially each node in the selected cluster $C_k$ which belongs to the selected net $N_i$ is defined to be a separate logical component so that the initial list of logical compontents comprises all nodes of the selected cluster which belong to the selected net $N_i$. With other words: The list of logical components comprises all nodes comprised in the relevant subgraph $g_k$ of the selected cluster $C_k$ for the selected net $N_i$, in particuliar the logical nodes $V_{ik}$.

In step 120 one of the logical components is selected from the list of logical components for processing.

In step 125 a route is searched between the selected component and another component from the same list of logical components which has to be connected to the selected component according to the subgraph $g_k$ of the selected cluster $C_k$ for routing of the selected net $N_i$. For searching a route between the selected component and the other component the topological graph of the selected cluster $C_k$ is used.

The usage of the topological graph for searching such a route is possible because the topological graph is representative of the allowed electrical connectivities which can be established in the circuit topology. Any known search algorithm can be used for finding a path in the given topological graph between the two components which are represented by vertices in the topological graph. If such a route is found in step 130 it is decided to go to step 135.

In step 135 the edge or the edges in the topological graph which represent the route which is found in step 125 is/are painted to indicate that these edge/edges are no longer available for routing another net. This is to prevent that electrical connectivities are established between different nets which would lead to mal functioning of the integrated circuit.

In step 140 the logical components for which an interconnecting route has been found in step 125 are logically united to one single component. The original components are deleted from the list of logical components and replaced by one single united component.

In step 150 the list of logical components is checked for the number of components which are left in the list. If there is more than one logical component left the control goes back to step 120 to select one of the residual logical components and to find a route between another residual component. After all the logical components are united into one logical component the variable i is incremented in step 155 to select the next net Ni to be routed. As a consequence in step 115 a new list of logical components for the selected net is established. The selected cluster $C_k$ remains the same. When all nodes of all nets Ni within the selected cluster $C_k$ are routed the variable k is incremented to select another cluster $C_k$ until all clusters are routed.

If no route is found in step 125 it is decided in step 130 to carry out step 160. In step 160 an obstructing route of another net which has already been routed previously is ripped up. This removal of the obstructing route allows to establish a route between the selected component and the other component as described with reference to step 125.

As a consequence of the ripping up of a route in the other net which had already been routed previously the corresponding logical components in the list of logical components are separated in the other net which has been ripped up. This is done in step 165. As a consequence at least two separate logical components result in the list of logical components for the ripped up net. The ripped up net is put back on the stack for later processing to find another route to interconnect the separated logical components.

After step 165 the control returns back to step 135 to paint the edge or the edges in the topological graph which represent the route which has been found due to the removal of the route of the other net.

In order to further speed up and enhance the above described method it is possible to select the logical components in step 120 according to a certain criteria: it is advantageous to select the logical component from the list which is the most constraint component. The most constraint component has the least options for electrical connectivities according to the topological graph.

For example the node N which is considered as a logical component here, can be accessed from four different directions according to the diagram shown in FIG. 6. This can be done through the feed throughs F1, F2, F7 or F8. Other nodes might have lesser or larger number of potential connectivities which determines the constraint factor. Hence each logical component in the list should have an associated constraint factor which is indicative of the number of options for electrical connectivities to or from the logical component.

Also when logical components are united in step 140 a new constraint factor is to be established. Usually when two components are united, the resulting logical component has a lower constraint factor because the bigger united logical component has usually more options for electrical connectivities.

What is claimed is:

1. A method for routing nets in an electronic device having a plurality of clusters, said clusters being separated by a channel area between the clusters, and said clusters having a plurality of nodes, each of said nodes being assigned to one of said nets, said method comprising the steps of:

a) for each set of nodes belonging to the same net:
      establishing a minimal Steiner tree between a sub set of said clusters which have at least one of said nodes of said set of nodes, said minimal Steiner tree logically interconnecting at least one of said nodes of said set of nodes of each of said clusters of said sub set of clusters;

b) for each of said Steiner trees found in step a):
      determining logical nodes where said Steiner tree intersects a boundary of said channel area;
      including said logical nodes in a graph representation of said net, so that first sub graphs covering said clusters and second sub graphs covering said channel area result; and c) for each cluster:
      routing each of said first sub graphs found in step b) independently from channel routing of said second sub graphs found in step b).

2. The method according to claim 1 further comprising the steps of d) for each of said clusters: for each node of said cluster forming a second graph representation to model potential electrical connectivities to other nodes within said cluster or to channel boundaries irrespective of any assignment of nodes to specific nets;

e) routing each of said first sub graphs found in step b) of claim 1 in accordance with the electrical connectivities as modeled by said second graphs.

3. The method according to claim 2, whereby said second graph representation includes vertices to represent potential electrical conductors and edges to represent potential electrical connections between said electrical conductors, whereby an edge can have one of the following types:

i) a first type of edge which represents that an electrical connectivity between electrical conductors can be established;

ii) a second type of edge which establishes a mutual exclusion relation with respect to different nets; and iii) a third type of edge which establishes a channel border relation for representation of said logical nodes.

4. A method for routing nets in an electronic device having a plurality of clusters, said clusters being separated by a channel area between the clusters, and said clusters having a plurality of nodes, each of said nodes being assigned to one of said nets, said method comprising the steps of:

a) for each set of nodes belonging to the same net:
      establishing a minimal Steiner tree between a sub set of said clusters which have at least one of said nodes of said set of nodes, said minimal Steiner tree logically interconnecting at least one of said nodes of said set of nodes of each of said clusters of said sub set of clusters;

b) for each of said Steiner trees found in step a):
      determining logical nodes where said Steiner tree intersects a boundary of said channel area;
      including said logical nodes in a graph representation of said net, so that first sub graphs covering said clusters and second sub graphs covering said channel area result;

c) for each cluster:
      routing each of said first sub graphs found in step b) independently from channel routing of said second sub graphs found in step b);

d) for each of said clusters: for each node of said cluster forming a second graph representation to model potential electrical connectivities to other nodes within said cluster or to channel boundaries irrespective of any assignment of nodes to specific nets;

e) routing each of said first sub graphs found in step b in accordance with the electrical connectivities as modeled by said second graphs; and for each of said clusters:

for each of said first sub graphs covering said cluster:

f) establishing a list of logical components comprising said nodes of said first sub graph, each of said nodes of said first sub graph being initially defined to be a separate logical component in said list;

g) repetitively selecting one of said logical components from said list until there is only one single logical component left in said list;

h) routing from the selected component to another logical component of the same list, if possible;

i) in case of finding a route in said step h): removing said selected component and said other component from said list; uniting said selected component and said other component to create a new logical component; inserting said united component into said component list;

j) in case of not finding a route in said step h): ripping up an obstructing route of another one of said first sub graphs which has been processed previously;

k) in case of ripping up an obstructing route in said step j): finding an alternative route to replace said obstructing route.

5. The method according to claim 4 whereby said step k) is carried out by logically splitting said united component of said other first sub graph into at least two logical components by ripping up said obstructing route and carrying out said step g) and said step h) to find said alternative route.

6. The method according to claim 4 whereby the logical component of said list is the most constrained component.

7. An electronic device having a plurality of clusters, said clusters being separated by a channel area between the clusters, and said clusters having a plurality of nodes, each of said nodes being assigned to one of a plurality of nets, said nets being routed in accordance with a method comprising the steps of a) for each set of nodes belonging to the same net:
establishing a minimal Steiner tree between a sub set of said clusters which have at least one of said nodes of said set of nodes, said minimal Steiner tree logically interconnecting at least one of said nodes of said set of nodes of each of said clusters of said sub set of clusters;

b) for each of said Steiner trees found in step a):
determining logical nodes where said Steiner tree intersects a boundary of said channel area;
including said logical nodes in a graph representation of said net, so that first sub graphs covering said clusters and second sub graphs covering said channel area result;

c) for each cluster:
routing each of said first sub graphs found in step b) independently from channel routing of said second sub graphs found in step b).

8. The electronic device according to claim 7, said method further comprising the steps of d) for each of said clusters: for each node of said cluster forming a second graph representation to model potential electrical connectivities to said node within said cluster;

e) routing each of said first sub graphs found in step b) of claim 7 in accordance with the electrical connectivities as modeled by said second graphs.

9. The electronic device according to claim 8, said method further comprising the steps of
for each of said clusters:
for each of said first sub graphs covering said cluster:

f) establishing a list of logical components comprising said nodes of said first sub graph, each of said nodes of said first sub graph being initially defined to be a separate logical component in said list;

g) repetitively selecting one of said logical components from said list until there is only one single logical component left in said list;

h) routing from the selected component to another logical component of the same list, if possible;

i) in case of finding a route in said step h) removing said selected component and said other component from said list; uniting said selected component and said other component to create a new logical component; inserting said united component into said component list;

j) in case of not finding a route in said step h): ripping up an obstructing route of another one of said first sub graphs which has been processed previously;

k) in case of ripping up an obstructing route in said step j): finding an alternative route to replace said obstructing route.

10. The electronic device according to claim 9, said method being characterized in that said step k) of claim 9 is carried out by logically splitting said united component of said other first sub graph into at least two logical components by ripping up said obstructing route and in that said step g) and said step h) of claim 9 are tarried out to find said alternative route.

11. The electronic device according to claim 10, said method being characterized in that said one of said logical components selected in said step g) of claim 9 is the logical component of said list which is the most constrained component.

12. A general purpose digital computer for routing of nets in an electronic device, said computer being programmed to carry out method for routing of nets of an electronic device having a plurality of cluster, said clusters being separated by a channel area between the clusters, and said clusters having a plurality of nodes, each of said nodes being assigned to one of said nets, said method comprising the step of:

a) for each set of nodes belonging to the same net:
establishing a minimal Steiner tree between a sub set of said clusters which have at least one of said nodes of said set of nodes, said minimal Steiner tree logically interconnecting at least one of said nodes of said set of nodes of each of said clusters of said sub set of clusters;

said computer being characterized by the method steps of:

b) for each of said Steiner trees found in step a):
determining logical nodes where said Steiner tree intersects a boundary of said channel area;
including said logical nodes in a graph representation of said net, so that first sub graphs covering said clusters and second sub graphs covering said channel area result;

c) for each cluster:
routing each of said first sub graphs found in step b) independently from channel routing of said second sub graphs found in step b).

13. A method for routing electrical connections between nodes in electronic devices, said devices having pluralities of clusters separated by channel areas, pluralities of nodes forming nets to be electrically connected together, wherein at least one net has nodes in different clusters to be electrically connected across said channel areas and nodes to be electrically connected within a single cluster, the method comprising the steps of:

a) for each particular net, logically interconnecting some nodes of said net by a minimal Steiner tree which interconnects all the clusters having nodes of that particular net by at least a single node;

b) for each particular net of step a), determining logical nodes where said logical interconnections of said Steiner trees intersect a channel area boundary and providing first graphs to represent clusters with nodes belonging to said particular net and the corresponding interconnections, and second graphs to represent channel areas of the corresponding intersections; and c) for each cluster, routing electrical connections within said clusters for said first graphs found in step b) independently from channel routing of electrical connections across channel areas for said second graph found in step b).

* * * * *